United States Patent [19]

Köhler

[11] 4,367,581
[45] Jan. 11, 1983

[54] METHOD OF MANUFACTURING AN ARRAY OF SOLAR CELLS

[75] Inventor: Kranz Köhler, Unterhaching, Fed. Rep. of Germany

[73] Assignee: Messerschmitt-Bolkow-Blohm GmbH, Fed. Rep. of Germany

[21] Appl. No.: 195,752

[22] Filed: Oct. 10, 1980

Related U.S. Application Data

[62] Division of Ser. No. 144,954, Apr. 29, 1980, Pat. No. 4,296,270.

[30] Foreign Application Priority Data

May 11, 1979 [DE] Fed. Rep. of Germany ....... 2919041

[51] Int. Cl.³ .................... B23P 17/00; H01L 31/04
[52] U.S. Cl. ........................................ 29/572; 29/589; 29/591; 29/854
[58] Field of Search ................. 29/572, 589, 591, 854; 136/244, 245, 292

[56] References Cited

U.S. PATENT DOCUMENTS

| 3,330,700 | 7/1967 | Golub et al. | 136/244 |
| 3,375,141 | 3/1968 | Julius | 136/244 |
| 3,713,893 | 1/1973 | Shirland | 136/244 |
| 4,301,322 | 11/1981 | Amick | 136/256 |

FOREIGN PATENT DOCUMENTS

| 2411690 | 9/1975 | Fed. Rep. of Germany | 136/244 |
| 2757301 | 7/1979 | Fed. Rep. of Germany | 136/244 |

Primary Examiner—Ervin M. Combs
Attorney, Agent, or Firm—McGlew and Tuttle

[57] ABSTRACT

An arrangement or array of solar cells comprises a plurality of cells each having contacting connectors which establish an electrically conducting connection between the individual solar cells. Each solar cell has a connector which projects slightly from the edge thereof and is of a selected profile or shape such that the contacting connectors of adjacent cells may be overlapped and connected to each other for electrical connection in an arrangement in which they do not come in contact with each other adjacent the solar cells.

10 Claims, 3 Drawing Figures

METHOD OF MANUFACTURING AN ARRAY OF SOLAR CELLS

This is a division of application Ser. No. 144,954 filed Apr. 29, 1980, U.S. Pat. No. 4,296,270.

FIELD AND BACKGROUND OF THE INVENTION

This invention relates in general to solar cells and in particular to a new and useful arrangement or array of such cells and to a method of manufacturing the array.

Solar arrays are known. Particularly in spaceship technology, the energy necessary for supplying the instruments and other devices of the spaceship is generated by semiconductor based solar arrays, also termed solar batteries or solar generators. These arrays extend in large-surface arrangement outwardly of the spaceship or cover the ship to intercept as much of the solar radiation as possible.

One of the principal problems in the manufacture of solar arrays, as well as their later application, is the intercontacting of the solar cells with one another. Usually, each N-type zone of one of the solar cells is connected in an electrically conducting manner to the P-type zone of the adjacent solar cell by means of contacting metal connectors, for example of silver, as disclosed for example, in U.S. Pat. Nos. 3,375,141 and 3,713,893. It is well known to join the contacting connectors to the solar cell either during the manufacture of the latter, for example, by vapor deposition (see German Offenlegungsschrift No. 1564935) or to connect the finished solar cells by means of separately manufactured contacting connectors which, in such a case, are welded, cemented, etc. thereto (see German Auslegungschrift No. 1927387).

The necessity of saving weight in spaceship applications leads to a tendency of reducing the thickness of the solar cells, for example from 0.67 mm as provided in the satellites DIAL and AEROS, to superthin cells such as those of 0.125 mm thickness including the coverings. The produced solar arrays are of the nature of foils. Contacting of such solar cells raises problems of expansion at temperature variations, or also of mechanical stresses which strongly influence the contacting connectors. Further, since the thin solar cells are of extremely delicate nature, a technique must be provided for interconnection which would not effect them in any way. For this reason, prior art contacting connectors such as disclosed, for example, in German Offenlegunschrift No. 1807818 which are directly soldered or cemented on the cell, are not satisfactory.

SUMMARY OF THE INVENTION

The invention is directed to a solar array of the above mentioned kind, preferably with thin solar cells, in which the cells cannot be affected or damaged neither while establishing connections to the individual solar cell nor while interconnecting solar cells with each other, and which, in use, is insensitive to any strain to which the solar array is subjected.

In accordance with the invention each solar cell is provided with a contacting connector which comprises a thin foil sheet having portions which extend outwardly from the associated cell and which are profiled with a particular shape so that connectors of adjacent cells may be overlapped and interconnected for electrical connection without coming into contact with each other.

The advantage obtained with the inventive solar array in use is primarily its high flexibility. Thermal expansions and also expansions caused by mechanical loads on the supporting structures are easily taken up due to the resilident interconnection of the solar cells. The individual solar cell can completely be equipped with the contacting connectors during manufacture, so that in application, all that must be done is to finish the provided specific array by welding the contacting connectors together. This may advantageously be effected by an automatically controlled laser welding operation. The finished solar cell itself is not affected by this operation in any way, since the welding is accomplished at a distance therefrom. In consequence, damage to the highly sensitive solar cells is prevented.

In accordance with the method of the invention, flat foil ribbons are applied to the solar cells by thermal-compression welding for example. Each connector which extends outwardly from the solar cell, is provided with a selected profile such as a corrugation so that adjacent cells may be interconnected by overlapping of the corrugated profiles of the adjacent connectors. The foil is advantageously cut by a laser and is applied to the solar cell by therm-compression welding. A current collecting layer is applied to the solar cell by vapor deposition. Connectors are advantageously stamped into a corrugated or wave shaped form after they have been joined to the solar cell.

Accordingly, it is an object of the invention to provide an improved solar cell array in which individual solar cells are provided with profiled contacting connectors which extend outwardly from the edge of the solar cell and which are provided with a profiling so that adjacent connectors may be overlapped and they are interconnected together electrically at the overlapped area.

A further object of the invention is to provide a method of manufacturing solar cells which comprises forming contacting connectors of flat foil ribbons and applying the flat foil ribbons by thermal-compression welding to bare, doped solar cells so that the ribbons have portions which extend outwardly from the edge of the solar cell and forming a selected profile into the contacting connector as the connector is cut away from a ribbon supply thereof.

A further object of the invention is to provide an array of solar cells which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
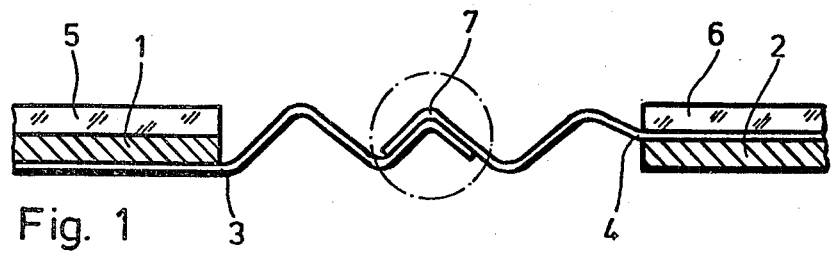
FIG. 1 is a partial sectional view of an array of solar cells showing two solar cells with the contacting connectors overlapped and electrically connected together in accordance with the invention.

Referring to the drawings in particular, the invention embodied therein in FIG. 1 comprises an array of solar cells each of which includes a solar cell body 1 or 2 and each of which has a contacting connector 3 or 4 applied thereto which includes a portion extending outwardly beyond the edge of the solar cell 2 and provided with a profiling such as a wave-shape corrugation etc. The overlapped portion 7 of the connector parts 3 and 4 are electrically connected together. Coverings 5 and 6 may be applied to the respective solar cell bodies 1 and 2 either directly over the solar cell body as shown on the left hand portion of FIG. 1 or over the contacting connector 4 as shown on the right hand portion of FIG. 1.

According to FIG. 1, two solar cells 1 and 2 are equipped with contacting connectors 3 and 4. The cells 1 and 2 are superthin solar cells having a structural crystal thickness of 50 microns. Coverings 5 and 6 for the respective cells have thicknesses of 50 microns, and the contacting connectors 3 and 4 have a thickness of 12 microns. Contacting connectors 3 and 4 connect the N-type and P-type conducting zones in a known manner. In the overlap zone 7, contacting connectors 3 and 4 are joined to each other by laser welding. The profile shape of contacting connectors 3 and 4 is not limited to the shown wavy corrugation, a horizontal, straight extension of the two contacting connectors 3 and 4 in the laser welding zone (overlap zone 7) may also be provided, for example.

The symmetrically distributed contacting connectors should project from the edges of the solar cell by about 0.5 mm. The (current-collecting) contacting surfaces on the back of the cell (not shown) may be designed as a network.

Figure 2:
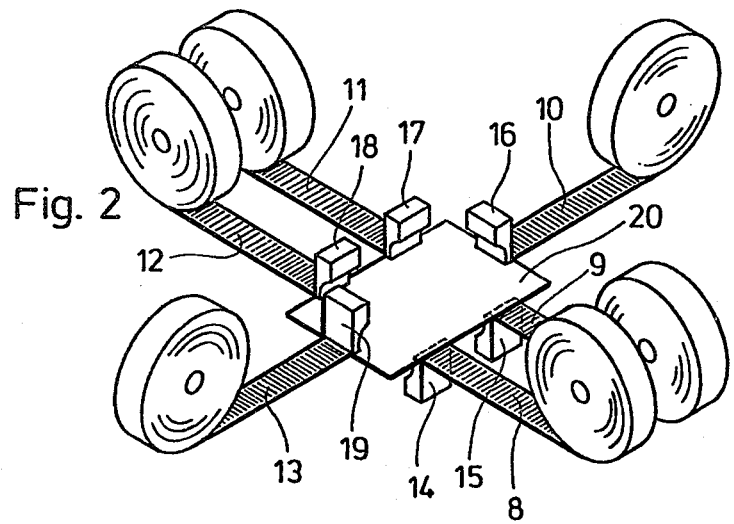
FIG. 2 is a front top perspective view of a solar cell array with foil ribbon contacting connectors.

FIG. 2 shows diagrammatically the equipment of a solar cell 20 with contacting connectors 8, to 13 in the form of cut-off silver foil ribbons. The foil ribbons are pre-stamped to obtain the selected uniform shape, their width is about 10 mm. The contacting connectors are secured to the bare, doped solar cell 20 by thermal-compression welding, such as is known from the manufacture of transistors and diodes. For this purpose, welding heads 14 to 19 are provided. Welding heads 14 and 15 serve to secure the connectors to the front side, and welding heads 17 and 18 secure the connectors on the rear side. The contacting connectors may be separated from the foil ribbons by stamping, or by using a laser. what is necessary is to consider the wave length of the shape of the contactors. This may be done in a simple way by using a matrix matching the shape of the wave.

In another variant (not shown), the waves of the contacting connector are impressed to a smooth foil ribbon as late as during the welding of the connectors to the solar cell, or after the welding, with a subsequent severing from the foil ribbon. With such a technique, matrixes for fixing the wave-length of the connectors may be omitted.

Figure 3:
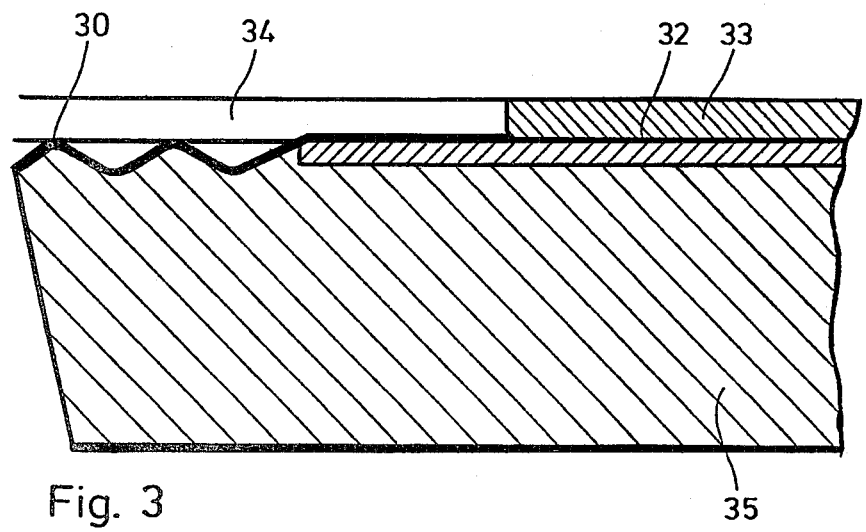
FIG. 3 is a enlarged partial sectional view of a solar cell having a vapor-deposited contacting connector thereon.

According to FIG. 3, the contacting connector 30 is applied by vapor deposition. A mask 34 determines the zone within which the contacting material is deposited up to the covering 33. The solar cell 32 is placed on a base plate 35 for vapor deposition. In the zone of contacting connector 30, base plate 35 is conformable to the desired shape of the contacting connctor. Base plate 35 amy also extend over the front portion of the semiconductor layer, so that a smooth transition between the contacting connector and the semiconductor layer is obtained.

In all variants of the method, the welding operation for interconnecting the solar cells to one another can be performed after the solar cells have been applied to their supporting structure.

While specific embodiments of the invention have been shown and described in detail to illustrate the application of the principles of the invention, it will be understood that the invention may be embodied otherwise without departing from such principles.

What is claimed is:

1. A method of manufacturing a solar cell array having a plurality of solar cells with N-type and P-type conducting zones, a plurality of contacting connectors electrically interconnecting the N-type with the P-type conducting zones of adjacent cells, and with each contacting connector extending outwardly from the periphery of a respective cell, comprising:

applying a foil ribbon to the surface of each of the plurality of solar cells so that each ribbon extends outwardly from at least one edge of each solar cell;

securing each ribbon to its repective solar cell to form each contacting connector;

applying a wave-shaped corrugated profile to each contacting connector at least at a portion of each connector extending outwardly from the at least one edge of each solar cell;

overlapping at least a portion of the contacting connectors of adjacent solar cells without the connector of one solar cell contacting an adjacent solar cell; and connecting the overlapping portions of the contacting connectors of adjacent solar cells.

2. A method according to claim 1, including securing each foil ribbon to each solar cell by thermal-compression welding.

3. A method according to claim 2, including applying said wave-shaped corrugated profile to each contacting connector by stamping.

4. A method according to claim 3 wherein the contacting connectors are formed by continuous lengths of ribbon which are cut away as the corrugated profile is formed and using a laser to cut away the contacting connector from a supply of foil material.

5. A method according to claim 3 including applying a current collecting layer on each solar cell by vapor deposition immediately after the thermal-compression welding of the contacting connectors.

6. A method according to claim 3 including stamping the contacting connectors to form the corrugated profile thereof after they have been joined to each solar cell.

7. A method according to claim 1, including applying and securing each foil ribbon by vapor deposition on each solar cell and using a molded base for the vapor deposition for applying the wave-shaped corrugated profile to each contacting connector.

8. A method according to claim 7, including simultaneously vapor-depositing a current collecting layer on each solar cell while each foil ribbon is vapor-deposited thereon.

9. A method according to claim 1, including connecting said overlapping portions by laser welding.

10. A method according to claim 2, including securing each ribbon to its repective solar cell simultaneously with the applying to each contacting connector of the wave-shaped corrugated profile.

* * * * *